May 1, 1973 SHINICHI NAKASHIMA ET AL 3,730,800

METHOD OF MAKING GERMANIUM SEMICONDUCTOR DEVICE

Filed Dec. 24, 1969

INVENTORS

SHINICHI NAKASHIMA, MORIO INOUE and HITOO IWASA

BY

Craig, Antonelli, Stewart & Hill ATTORNEYS

United States Patent Office 3,730,800
Patented May 1, 1973

3,730,800

METHOD OF MAKING GERMANIUM SEMICONDUCTOR DEVICE

Shinichi Nakashima, Suita, and Morio Inoue and Hitoo Iwasa, Takatsuki, Japan, assignors to Matsushita Electronics Corporation, Kadoma, Osaka Prefecture, Japan Filed Dec. 24, 1969, Ser. No. 887,935
Claims priority, application Japan, Dec. 27, 1968, 44/433; Dec. 30, 1968, 44/346
Int. Cl. H01l 7/50
U.S. Cl. 156—8 2 Claims

ABSTRACT OF THE DISCLOSURE

A method of making a germanium mesa-type semiconductor device by mesa-etching employing as an etching mask, a film of $SiO_2$ applied onto the surface of a germanium substrate. The $SiO_2$ film can be formed by thermal decomposition of organo-oxy-silane so as to have a thickness of about 1000 to about 7000 A. The mesa-etching can be made either by electrolytic etching or by chemical etching.

BACKGROUND OF THE INVENTION

This invention relates to a method of making a mesa-type semiconductor device. More particularly, this invention relates to an improved method of making mesa-type germanium devices.

A semiconductor device of mesa-type entails the advantages that its junction can be made to have a large area by the diffusion method, which enables handling of large power, and that a device having high reverse voltage can be easily made. Such mesa-type constitution is widely adopted in silicon transistors.

In the conventional method of mesa-etching, the process resides in that a specified region defined to be made a mesa on the surface of the semiconductor substrate is preliminarily covered by a protecting wax or an acid-resistive and photo-sensitive protecting substance such as the one called "Photo-Resist" (registered trademark of Eastman Kodak Co., U.S.A.), and then, the remaining part of the substrate exposed around the protecting wax or protecting substance is etched away by acid.

The above-mentioned conventional method has the drawback that the control of the mesa-etching is far from being satisfactory in respect of accuracy of dimension. That is to say, it is difficult to form a mask with high accuracy in the covering by the protecting wax, and it is also difficult to obtain stable etching because the photo-sensitive protecting substance is weak, causing unnecessary advancing of side-etching and damaging the mesa form, or resulting in generating undesirable heat and consequently deforming or tearing the mask.

Among other conventional methods, there is known a method of utilizing a metal electrode film as an etching mask. In such method, the selection of the metal is limited to such a stable metal as gold, because the masking effect depends upon the combination with the etching acid. Even gold has the drawback that it forms a eutectic alloy at considerably low temperature with silicon or germanium, and thereby excessively advances side-etching due to formation of the unstable eutectiv alloy at the boundary between the substrate and the metal mask film, thus preventing the obtainment of a satisfactory mesa constitution.

SUMMARY OF THE INVENTION

This invention has been made with a view to overcoming the above-mentioned various problems in making germanium mesa devices.

An object of the present invention is to obtain a novel method of making a mesa-type semiconductor device of germanium with a high accuracy.

A further object of the present invention is to obtain an industrially satisfactory method of making a mesa-type semiconductor device of germanium.

A few practical uses have been made of the germanium mesa device, and also few researches have been reported in this field, because the germanium device has essentially a lower reverse voltage than a silicon device.

The inventors hereof have discovered that a germanium device could be mesa-etched quickly and accurately by a process, wherein a film of $SiO_2$ (silicon dioxide) was formed on a germanium substrate by thermal-decomposition or pyrolysis of organo-oxy-silane and then etching was carried out using the $SiO_2$ film as an etching mask. Either a chemical etching method or an electrolytic etching method can be employed for the etching operation of this invention, without harming the $SiO_2$ film.

BRIEF DESCRIPTION OF THE DRAWINGS

This invention will be more fully understood by reference to the following detailed description of a specific embodiment thereof, taken in connection with the accompanying drawing, wherein.

DETAILED DESCRIPTION

The method of the present invention comprises the steps of:

forming on a germanium substrate, a silicon dioxide film to cover an area or areas to be left as a mesa area or areas, and etching the germanium substrate, using the silicon dioxide film as an etching mask, so that the area left exposed by the silicon dioxide film is mesa-etched.

The etching can be made either by a chemical etching method or by a conventional electrolytic etching method.

The chemical etching can be made, for instance, by immersing the germanium substrate having a silicon dioxide film into an etching bath of a hydrogen peroxide solution ($H_2O_2+H_2O$) which is heated to over 50° C.

The electrolytic etching can be made, for example, by using a sodium hydroxide solution ($NaOH+H_2O$) as electrolyte with the germanium substrate fixed to the anode and a platinum electrode utilized as cathode.

The details of the present invention are described hereinafter, referring to the accompanying drawings.

Figure 1:
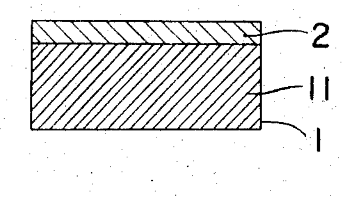
FIGS. 1 to 4 are cross-sectional elevation views illustrating the various steps of the manufacture of the germanium device according to the present invention.

At first, a germanium wafer 1 is doped with an impurity in a conventional manner so that a wafer 1 is to be formed consisting of a substrate 11 and of a thin diffused layer 2, as shown in FIG. 1.

In one example, antimony is diffused as an impurity into a germanium substrate 11 of P-type germanium having a concentration of $5\times10^6$ atoms per cubic centimeter, so as to obtain an antimony doped N-type diffusion layer 2 of a concentration of about $2\times10^{18}$ atoms per cubic centimeter at the surface and of 3 micron thickness.

Figure 2:
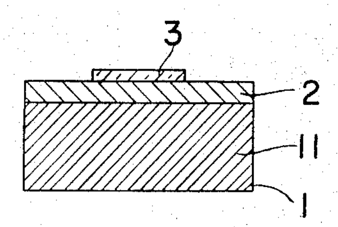

On the surface of the diffused layer 2, a film 3 of silicon dioxide ($SiO_2$) of 5000 A. thickness is formed by means of a thermal decomposition of an organo-oxysilane and heating it at about 600° C., and then, the film is etched by well-known photo-lithography so that the film 3 remains unetched in desired mesa-shaped area, for instance, a circle of 100 micron diameter, as shown in FIG. 2.

Figure 3:
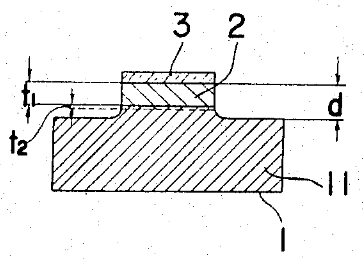

The germanium wafer 1 is then immersed into a preliminarily prepared chemical etching bath, and mesa-etched to form the wafer as shown in FIG. 3.

In this first example, the chemical etching bath contains hydrogen peroxide solution ($H_2O_2+H_2O$) preferably kept over 50° C. When the bath is under 50° C. the etching speed is too low for industrial application, and moreover, the etched surface lacks lustre. According to experiments, the etching speed "$S_e$," namely, the displacement of the etched front per minute is 3000 A. per minute when the etching is made in a bath of hydrogen peroxide solution of 30 percent concentration (by weight) kept at about 85° C. Such etching speed is considered satisfactory for industrial application, and the etched surface has a good lustre. When the concentration exceeds 30 percent, the etching advances too quickly, and when the concentration is under 10 percent, the etching is too slow for industrial application.

The activation energy of the above etching which is schematically measured from a graph plotting the relations between log $S_e$ and $1/T$, where $S_e$ is the etching speed and T is the absolute temperature of the bath, shows the value of 9.5 kilo calorie per mol. This value represents small dependency of etching speed $S_e$ on the temperature of the bath; namely, a small change of etching speed against relatively low accuracy of control, providing satisfactory industrial utility. The applicable upper limit temperature of the etching solution must be below 100° C. When the temperature of the solution is at an extremely high point, the decomposing reaction represented by $H_2O_2\rightarrow H_2O+\frac{1}{2}O_2$ becomes too speedy to control the concentration of the etching solution, causing poor control of the etching speed. The industrially practical upper limit temperature of the etching solution was experimentally found to be about 95° C.

Although the silicon dioxide film is essentially stable against the hot hydrogen-peroxide solution, only the brim part of the film, under which the substrate is side-etched, chips off during the etching. Although the cause of this chipping-off is not clear, this phenomenon is rather convenient for industrial control of the mesa form. That is, as a result of chipping-off of the brim part, the etching speed becomes even. If there were no such phenomenon of chipping-off of the brim part over the side-etched cave, the brim part would remain like broken eaves irregularly extending over the side-etched cave, and would consequently disable the formation of a neatly etched mesa with accurate dimensions. It was experimentally found that the etching speed in the downward; namely, perpendicular direction is almost the same as that in the lateral; namely, horizontal direction, in the above-mentioned etching with hydrogen-peroxide. Accordingly, the depth of mesa-etching can be known with accuracy by measuring the extent of side-etching and comparing the dimensions of the silicon dioxide film measured before and after the etching, respectively.

In designing the device, the etching depth "$d$" shown in FIG. 3 should be made larger than the total of the dimensions of the junction depth $t_1$ and of the depth of the space-charge layer (depletion layer) $t_2$, and the shape of the silicon peroxide film 3 before etching should be made broader than the designed final shape by the surplus dimension of "$d$."

Figure 4:
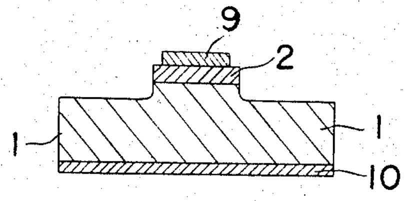

As shown in FIG. 4, an electrode layer 9 of metal such as gold is provided so as to form an ohmic contact with the top surface of the diffused layer 2 after conventional removal of the silicon dioxide film 3, an another electrode layer 10 of metal such as molybdenum is provided so as to form an ohmic contact with the bottom surface of the substrate 1, and thus a mesa-type germanium device such as a diode is obtained.

A second example described hereinafter comprises an electrolytic etching process in place of the chemical etching process in the first example.

Figure 5:
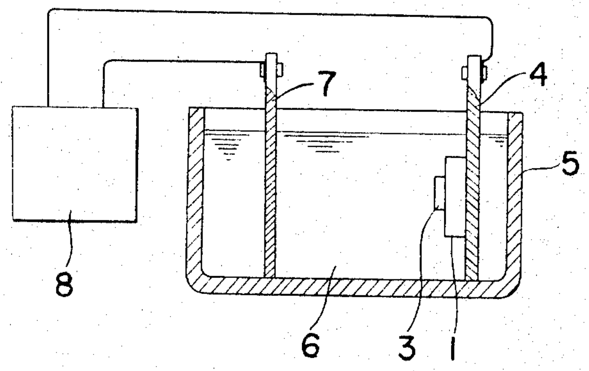
FIG. 5 is a schematic diagram of an electrolytic etching system used in the method of the present invention.

In the second example, the steps up to the etching of the silicon dioxide film are the same as those of the first example. As shown in FIG. 5, the wafer 1 provided with the silicon dioxide film 3 of desired shape is then fixed by conductive bond onto anode 4 of carbon placed in an etching bath tub 5. The wafer 1 on the anode 4 and a cathode 7 made of platinum are immersed in electrolyte 6 within the tub 5. Electrolytic etching is done by supplying D.C. current from a D.C. power source 8 through the anode 4 and the cathode 7. A cold sodium hydroxide solution of 10 percent concentration by weight, preferably under 30° C. can be employed as the etching electrolyte 6. When the electrolyte is too warm, side-etching underneath the silicon dioxide film advances excessively, almost damaging the masking effect. At the current density of 160 milliamperes per cm.$^2$, the etching speed is 5 microns per minute. And etching up to the depth of 10 microns can be performed in 2 minutes, while the side etching is about 10 microns which is comparable to that of a conventional etching mask employing an etching mask of wax film. For good performance, the concentration of the alkaline hydroxide is preferably 2–20 percent, wherein the optimum value is 5–10 percent, and the current density is preferably 0.1–1 ampere per cm.$^2$.

The recommendable thickness of the silicon dioxide film is between about 1000 A. and about 7000 A. Films thinner than about 1000 A. have many pin-holes, resulting in being unstable in etching, being liable to be side-etched, or being etched off in its undesirable part of the mesa top. Films thicker than 7000 A. have the drawback of imposing on the substrate a heavy stress owing to the difference between the expansion coefficients of the film and that of the substrate, resulting in irregular etching. The optimum result can be obtained with a film thickness of about 3000 A. to about 6000 A.

As shown in FIG. 4, an electrode layer 9 of a metal such as gold is provided so as to form an ohmic contact with the top surface of the diffused layer 2 after removal of the silicon dioxide film 3, and another electrode layer 10 of a metal such as molybdenum is provided so as to form an ohmic contact with the bottom surface of the substrate, and thus a mesa-type germanium device such as diode is obtained.

In the foregoing two examples, the etching masks are silicon dioxide films, and the acid resistive and photo-sensitive mask which has been employed to etch the silicon dioxide film in the desired shape is removed prior to the etching process. However, such removal of the photo-sensitive mask is not always imperative. Namely, the photo-sensitive mask once used as an etching mask in the process of etching the silicon dioxide film can be retained on the silicon dioxide film so as to form a double-layered protection film. Such double-layered etching mask is recommended for the chemical etching process in a low temperature etching solution in which the photo-sensitive mask stays stable, because such double-layered mask has the advantage that even when the silicon dioxide film is very thin, its pin-holes can be well covered by the photo-sensitive film.

In the case where a so-called "after-etch" process; namely, an additional etching process for the improvement of the characteristics is carried out after the removal of the silicon dioxide etching mask, the same etching solution that has once been used for the mesa-etching can be employed. This is useful from the viewpoint of simplifying the manufacturing process.

This invention is also applicable to the making of germanium devices of many kinds, such as diode, transistors or integrated circuits, which require a process of mesa-etching or an etching process essentially the same as the mesa-etching.

What is claimed is:

1. A method of making a germanium semiconductor device comprising the steps of:
   forming on a germanium substrate a silicon dioxide film to cover an area or areas to become a mesa area or areas and
   etching said germanium substrate by applying a hydrogen peroxide solution of about 10 to 30% concentration by weight kept at a temperature between about 50° C. and about 95° C. to said silicon dioxide film used as an etching mask so that the area left exposed by said silicon dioxide film is mesa-etched.

2. A method of making a germanium semiconductor device according to claim 1, wherein said silicon dioxide film is of a thickness between about 1000 A. and about 7000 A.

References Cited

UNITED STATES PATENTS

| | | | |
|---|---|---|---|
| 3,243,323 | 3/1966 | Corrigan et al. | 156—17 X |
| 2,878,147 | 3/1959 | Beale | 156—17 UX |
| 2,974,075 | 3/1961 | Miller | 156—17 X |
| 2,994,121 | 8/1961 | Shockley | 156—17 UX |
| 3,193,418 | 7/1965 | Cooper et al. | 156—17 X |

WILLIAM A. POWELL, Primary Examiner

U.S. Cl. X.R.

156—16, 17; 204—143